(12) United States Patent
Ebrahimzadeh (10) Patent No.: US 10,393,822 B1
(45) Date of Patent: Aug. 27, 2019

(54) APPARATUS, SYSTEMS, AND METHODS FOR CHARGING PARTIAL USE BATTERIES

(71) Applicant: Facebook, Inc., Menlo Park, CA (US)

(72) Inventor: Soheil Ebrahimzadeh, San Francisco, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 99 days.

(21) Appl. No.: 15/654,543

(22) Filed: Jul. 19, 2017

(51) Int. Cl.
*G01R 31/392* (2019.01)
*G06F 1/3212* (2019.01)
*H01M 10/44* (2006.01)
*G01R 31/3835* (2019.01)

(52) U.S. Cl.
CPC ......... *G01R 31/392* (2019.01); *G06F 1/3212* (2013.01); *H01M 10/44* (2013.01); *G01R 31/3835* (2019.01)

(58) Field of Classification Search
CPC .............. G01R 31/3679; G01R 31/362; G01R 31/392; H01M 10/44; G06F 1/3212
See application file for complete search history.

(56) References Cited

U.S. PATENT DOCUMENTS

| | | | |
|---|---|---|---|
| 9,348,390 B2 * | 5/2016 | Du | H02J 9/061 |
| 9,891,685 B1 | 2/2018 | Marr et al. | |
| 2009/0066295 A1 | 3/2009 | Takeno | |
| 2011/0304211 A1 * | 12/2011 | Peterson | G06F 1/263 |
| | | | 307/48 |
| 2015/0377971 A1 * | 12/2015 | Keating | G01R 31/3606 |
| | | | 307/130 |
| 2016/0116548 A1 | 4/2016 | Ghantous et al. | |
| 2016/0266979 A1 * | 9/2016 | Glover | G06F 9/30083 |
| 2017/0093207 A1 * | 3/2017 | Park | H02J 9/061 |

OTHER PUBLICATIONS

Open Rack Standard V2.0; http://files.opencompute.org/oc/public.php?service=files&t=1088a8d608fb48fd46828af3fdf9a861, Jan. 17, 2017.
Soheil Ebrahimzadeh et al.; Apparatus, Systems, and Methods for Charging Partial-Use Batteries; U.S. Appl. No. 15/654,543, filed Jul. 19, 2017.
Ebrahimzadeh et al., "Apparatus, Systems, and Methods for Pulse Charging Rechargeable Batieries", U.S. Appl. No. 15/654,553, filed Jul. 19, 2017, 50 pages.

* cited by examiner

*Primary Examiner* — Nha T Nguyen
(74) *Attorney, Agent, or Firm* — FisherBroyles, LLP (57) ABSTRACT

A computer-implemented method for charging partial-use batteries may include (1) determining a discharge duration for a partial-use battery, (2) estimating an age of the partial-use battery, (3) calculating, based on the age, a partial charge voltage for the partial-use battery that will enable a discharge cycle of the partial-use battery to last for the discharge duration, and (4) floating the voltage of the partial-use battery at the partial charge voltage to prolong the partial-use battery's life. The partial-use battery may be a backup battery of a power supply that will experience a transition from a first power source to a second power source, the transition may be expected to last for a transitional duration, the backup battery may supply power to the power supply during the transition, and the discharge duration may be greater than or equal to the transitional duration. Various other methods, systems, and apparatus are also disclosed.

20 Claims, 8 Drawing Sheets

| Charge-Voltage Lookup Table 172 |||
|---|---|---|
| AGE | DISCHARGE DURATION | CHARGE VOLTAGE |
| 36 Months | 90 Seconds | 45V |
| 48 Months | 90 Seconds | 47.5V |
| 60 Months | 90 Seconds | 50V |
| 72 Months | 90 Seconds | 52.5V |

APPARATUS, SYSTEMS, AND METHODS FOR CHARGING PARTIAL USE BATTERIES

BACKGROUND

Many of today's computing systems are powered by power sources that are not always reliable. In some instances, a power supply of a computing system, like those found in a typical data center, may periodically transition to auxiliary power sources when primary power sources experience disruptions. For example, in a typical data center, computing systems are generally powered by mains power but may periodically transition to auxiliary generators during mains-power disruptions. After primary power sources are restored, an additional transition generally must occur back to the primary power sources from auxiliary power sources. During transitions between primary and auxiliary power sources, a power supply may not receive power from either power source. While transitions between primary and auxiliary power sources may be quick, commonly occurring in seconds or a few minutes, these transitions are typically not instantaneous.

Because of the non-instantaneous transitions between primary and auxiliary power sources, typical computer-system power supplies generally rely on backup batteries to supply power during the transitions. Unfortunately, most batteries have limited lifespans, which are generally far shorter than the lifespans of the power supplies to which they supply backup power. As a result, backup batteries may limit the lifespans of the power supplies or must be replaced to ensure that the power supplies deliver uninterrupted power. Additionally, to ensure that backup batteries of power supplies perform their designed role, backup batteries may need to be replaced long before the ends of their expected lifespans.

A typical battery charger may charge a depleted rechargeable battery by applying a constant current to the rechargeable battery until the voltage of the rechargeable battery reaches a predetermined threshold, after which the battery charger may apply a constant voltage to the rechargeable battery until the rechargeable battery is fully charged, which may maximize the available charge of the rechargeable battery and/or the amount of time between a full charge of the rechargeable battery and a full discharge of the rechargeable battery. Unfortunately, this method of charging batteries may unnecessarily reduce the lifespan of batteries in certain circumstances. The instant disclosure, therefore, identifies and addresses a need for apparatus, systems, and methods that prolong the expected lifespans of batteries, especially backup batteries of power supplies.

SUMMARY

As will be described in greater detail below, the instant disclosure describes various systems and methods for charging partial-use batteries (e.g., batteries of power supplies that are used for backup power during short transitions between the power supplies' primary and auxiliary power sources) to variable age-based charge voltages that may prolong the partial-use batteries' lifespans. In one example, a method for charging partial-use batteries may include (1) determining a discharge duration for a partial-use battery, (2) estimating an age of the partial-use battery, (3) calculating, based at least in part on the age of the partial-use battery, a partial charge voltage for the partial-use battery that will enable a discharge cycle of the partial-use battery to last for the discharge duration, and (4) floating the voltage of the partial-use battery at the partial charge voltage to prolong the life of the partial-use battery.

In some examples, (1) the partial-use battery may include a backup lithium-ion battery of a power supply, (2) the power supply may experience a transition from a first power source to a second power source, (3) the transition may be expected to last for a transitional duration, (4) the backup lithium-ion battery may supply power to the power supply during the transition, and (5) the discharge duration may be greater than or equal to the transitional duration. In one example, (1) the first power source may include mains power, (2) the second power source may include one or more alternating-current generators, and (3) the transitional duration may be equal to the sum of a start-up duration of the alternating-current generators and a buffer duration. Alternatively, the first power source may include one or more alternating-current generators, and the second power source may include mains power. In some examples, the power supply may supply power within a data-center rack and/or the discharge duration may be less than or equal to 90 seconds. In at least one example, the discharge duration may be equal to the sum of the transitional duration and a buffer duration.

In some examples, the partial charge voltage may be less than a voltage limit of the partial-use battery, and the voltage limit of the partial-use battery may include a voltage of the partial-use battery when the partial-use battery may be considered fully charged or a nominal voltage of the partial-use battery. In various examples, the step of estimating the age of the partial-use battery may include using a nominal capacity of the partial-use battery or a measured capacity of the partial-use battery to estimate the age of the partial-use battery. In some examples, the measured capacity of the partial-use battery may be measured when the partial-use battery was manufactured. Additionally or alternatively, the step of estimating the age of the partial-use battery may include measuring a present capacity of the partial-use battery and then using the present capacity of the partial-use battery to estimate the age of the partial-use battery.

In some examples, the computer-implemented method may further include (1) estimating, at a subsequent point in time, an updated age of the partial-use battery, (2) calculating, based at least in part on the updated age of the partial-use battery, an updated partial charge voltage for the partial-use battery that will enable a subsequent discharge cycle of the partial-use battery to last for the discharge duration, and (3) floating the voltage of the partial-use battery at the updated partial charge voltage to further prolong the life of the partial-use battery. Generally, the updated partial charge voltage may be greater than the partial charge voltage.

In addition, a corresponding backup-battery charging system for charging partial-use batteries may include (1) a power supply that may experience a transition from a first power source to a second power source that may be expected to last for a transitional duration and (2) a battery backup unit. In some examples, the battery backup unit may include (1) a backup battery that supplies power to the power supply during the transition and (2) several modules stored in memory, including (a) a determining module that determines a backup discharge duration for the backup battery that is greater than or equal to the transitional duration, (b) an estimating module that estimates an age of the backup battery, (c) a calculating module that calculates, based at least in part on the age of the backup battery, a partial charge voltage for the backup battery that will enable a discharge cycle of the backup battery to last for the backup discharge duration, and (d) a charging module that floats the voltage of the backup battery at the partial charge voltage to prolong the life of the backup battery. In some examples, the battery backup unit may also include at least one physical processor that executes the determining module, the estimating module, the calculating module, and the charging module.

In some examples, the estimating module may estimate the age of the backup battery based on a nominal capacity of the backup battery or a measured capacity of the backup battery that was measured when the backup battery was manufactured. In other examples, the estimating module may estimate the age of the backup battery by measuring a present capacity of the backup battery and using the present capacity of the backup battery to estimate the age of the backup battery. In some examples, the battery backup unit may further include a register that may be accessible to the power supply. In these examples, the charging module may float the voltage of the backup battery at the partial charge voltage by (1) writing a value indicating the partial charge voltage to the register and (2) issuing a command to the power supply to charge the backup battery. The power supply may then charge the backup battery in response to the command by (1) reading the value indicating the partial charge voltage from the register and (2) charging the backup battery to the partial charge voltage.

In some examples, (1) the first power source may include mains power, (2) the second power source may include one or more alternating-current generators, and (3) a start-up duration of the one more alternating-current generators may be less than or equal to the transitional duration. In at least one example, (1) the power supply may supply power within a data-center rack, (2) the backup battery may include a lithium-ion battery, and (3) the backup discharge duration may be less than or equal to 90 seconds.

In addition, a battery backup apparatus for charging partial-use batteries may include (1) a backup battery that supplies power to a power supply during a transition of the power supply from a first power source to a second power source that may be expected to last for a transitional duration and (2) a battery-management subsystem that (a) determines a backup discharge duration for the backup battery that is greater than or equal to the transitional duration, (b) estimates an age of the backup battery, (c) calculates, based at least in part on the age of the backup battery, a partial charge voltage for the backup battery that will enable a discharge cycle of the backup battery to last for the backup discharge duration, and (d) floats the voltage of the backup battery at the partial charge voltage to prolong the life of the backup battery. In at least one example, the battery backup apparatus may further include a register that may be accessible to the power supply. In this example, the battery-management subsystem may float the voltage of the backup battery at the partial charge voltage by (1) writing a value indicating the partial charge voltage to the register and (2) issuing a command to the power supply to charge the backup battery. The power supply may then charge the backup battery in response to the command by (1) reading the value indicating the partial charge voltage from the register and (2) charging the backup battery to the partial charge voltage.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for charging partial-use batteries. The term "partial-use battery," as used herein, generally refers to any rechargeable battery that is expected to be used in a way that does not require (1) the battery to be fully charged, (2) the amount of time between a full charge of the battery and a full discharge of the battery to be maximized, and/or (3) the available charge of the battery to be maximized. In some examples, the term "partial-use battery" may refer to a battery that is expected to be used for a predetermined discharge duration that is less than the amount of time that would be taken to completely discharge the battery from a fully charged state. As such, a partial-use battery may be capable of performing its intended functions from a partially charged state (i.e., when charged to a partial charge voltage that is less than the voltage of the battery when the available charge of the battery is maximized).

In some examples, the term "partial-use battery" may refer to a backup battery of a power supply that is expected to experience a transition from a first power source to a second power source during which the backup battery will supply backup power to the power supply. In these examples, if initially fully charged, the backup battery may not be expected to be fully discharged while supplying power to the power supply during any transition. As such, the amount of time during which the backup battery is expected to supply power to the power supply may be less than the amount of time that would pass during a complete discharge cycle of the backup battery if started from a fully charged state.

The speed at which some batteries (e.g., lithium-ion batteries) age or lose capacity may be affected by the voltage levels to which the batteries are charged. Generally, the higher the voltage level to which a battery is charged, the higher the speed at which the battery ages or loses capacity. As such, and as will be explained in greater detail below, by partially charging a partial-use battery so that a discharge cycle of the partial-use battery will last for only a needed discharge duration rather than charging the partial-use battery to an unnecessarily high voltage level (e.g., a voltage level at which the partial-use battery is considered fully charged), the apparatus, systems, and methods described herein may prolong the lifespan of the partial-use battery. Moreover, by periodically updating the voltage level at which the partial-use battery is partially charged based on the partial-use battery's age, the apparatus, systems, and methods described herein may ensure that additional discharge cycles of the partial-use battery can last for the needed discharge duration despite decreases in the partial-use battery's capacity that may occur as the partial-use battery ages. In some examples, when a partial-use battery is new, the apparatus and systems described herein may float its voltage at a first charge voltage and may increase the charge voltage over time as the partial-use battery ages in order to maintain a required discharge duration. Embodiments of the instant disclosure may also provide various other advantages and features, as discussed in greater detail below.

The following will provide, with reference to FIGS. 1-4 and 8, detailed descriptions of example apparatus and systems for charging partial-use batteries. Detailed descriptions of corresponding computer-implemented methods will also be provided in connection with FIGS. 5-7.

Figure 1:
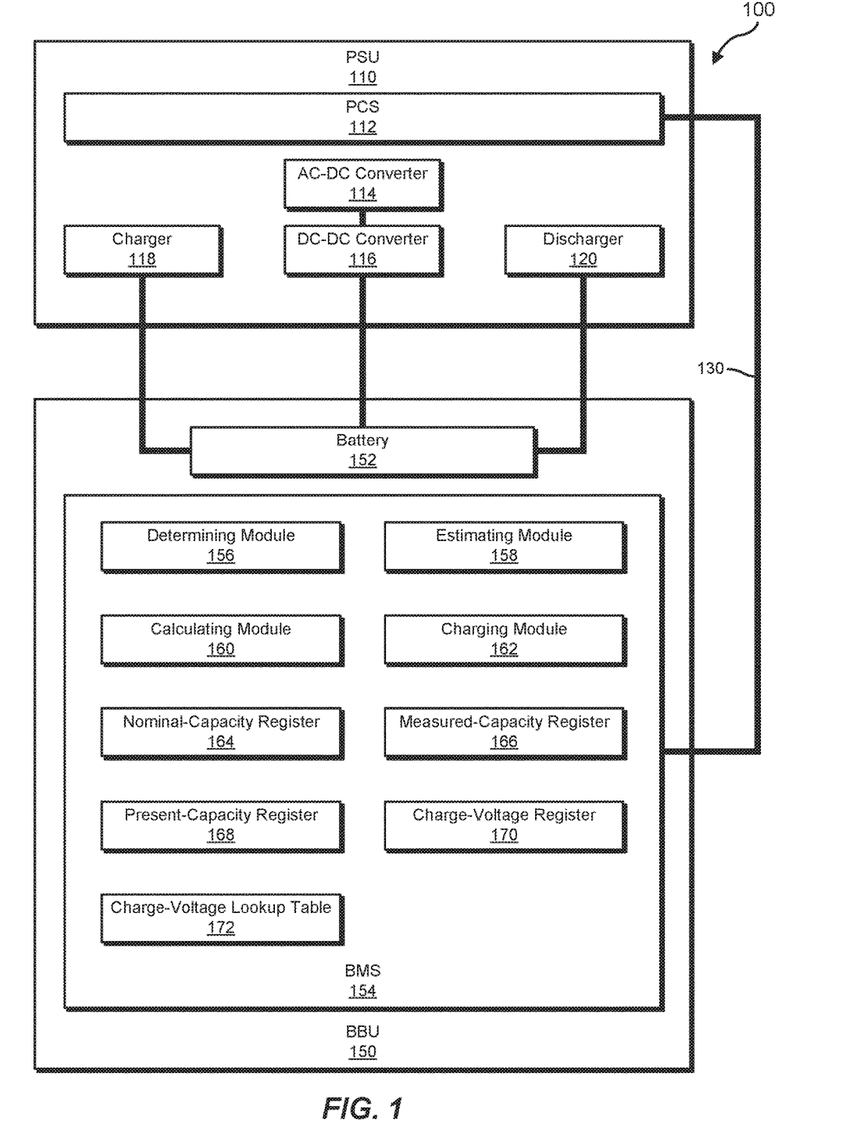
FIG. 1 is a block diagram of an exemplary power-supply system for charging partial-use batteries.

FIG. 1 is a block diagram of an example power-supply system (PSS) 100 for charging partial-use batteries. As illustrated in this figure, example power-supply system 100 may include a power-supply unit (PSU) 110 and a battery backup unit (BBU) 150 connected via a communication channel 130 (e.g., an analog or digital communication channel such as an Inter-Integrated Circuit (I²C) serial computer bus). As shown in this example, power-supply unit 110 may include a power control system (PCS) 112, an AC-DC converter 114, a DC-DC converter 116, a smart battery charger 118, and a battery discharger 120. Additionally, battery backup unit 150 may include a partial-use battery 152 and a battery-management system (BMS) 154. As illustrated in FIG. 1, battery-management system 154 may include one or more modules for performing one or more tasks. As will be explained in greater detail below, battery-management system 154 may include a determining module 156, and estimating module 158, a calculating module 160, and charging module 162. Although illustrated as separate elements, one or more of the modules in FIG. 1 may represent portions of a single module or application. Moreover, while modules 156-162 are illustrated in FIG. 1 as part of battery backup unit 150, in at least some examples, one or more of modules 156-162 may be configured as part of power-supply unit 110.

As illustrated in FIG. 1, battery-management system 154 may also include one or more hardware registers for storing data. Battery-management system 154 may also include a charge-voltage lookup table 172 that maps discharge durations to partial charge voltages based on battery ages. In at least one example, charge-voltage lookup table 172 may represent a lookup table with values supplied by a battery vendor that indicate, for a particular age of a battery, what charge voltage to supply to the battery so that the battery can supply power for a specified duration (e.g., 90 seconds).

Figure 2:
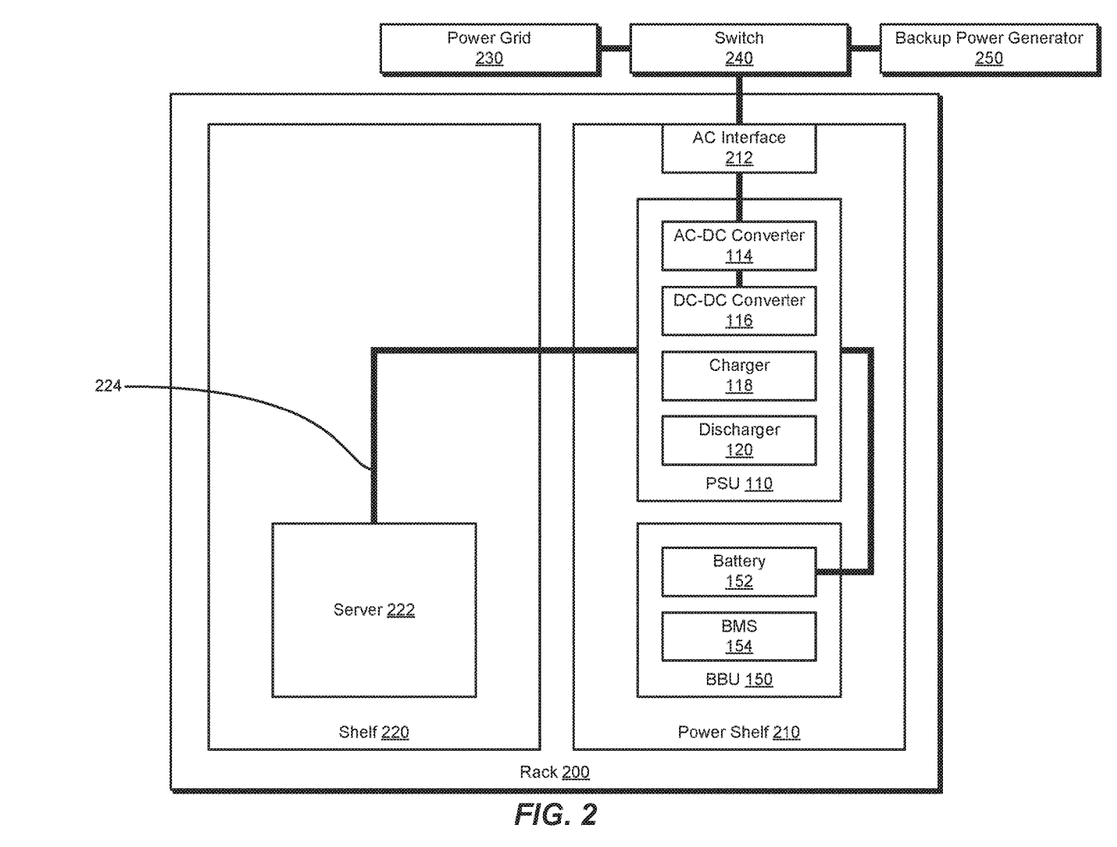
FIG. 2 is a block diagram of an example configuration of an exemplary power-supply system for charging partial-use batteries.

Example power-supply system 100 in FIG. 1 may be implemented and/or configured in a variety of ways. For example, all or a portion of example power-supply system 100 may represent portions of a power shelf of a data-center rack. For example, as shown in FIG. 2, all or a portion of example power-supply system 100 may represent portions of example data-center rack 200 that houses one or more shelves (e.g., a power shelf 210 and a shelf 220). In some examples, power shelf 210 may be capable of providing uninterrupted power to the server computing devices hosted within shelf 220 (e.g., server 222). In the illustrated example, power shelf 210 may include power-supply unit 110 and backup battery unit 150.

Figure 3:
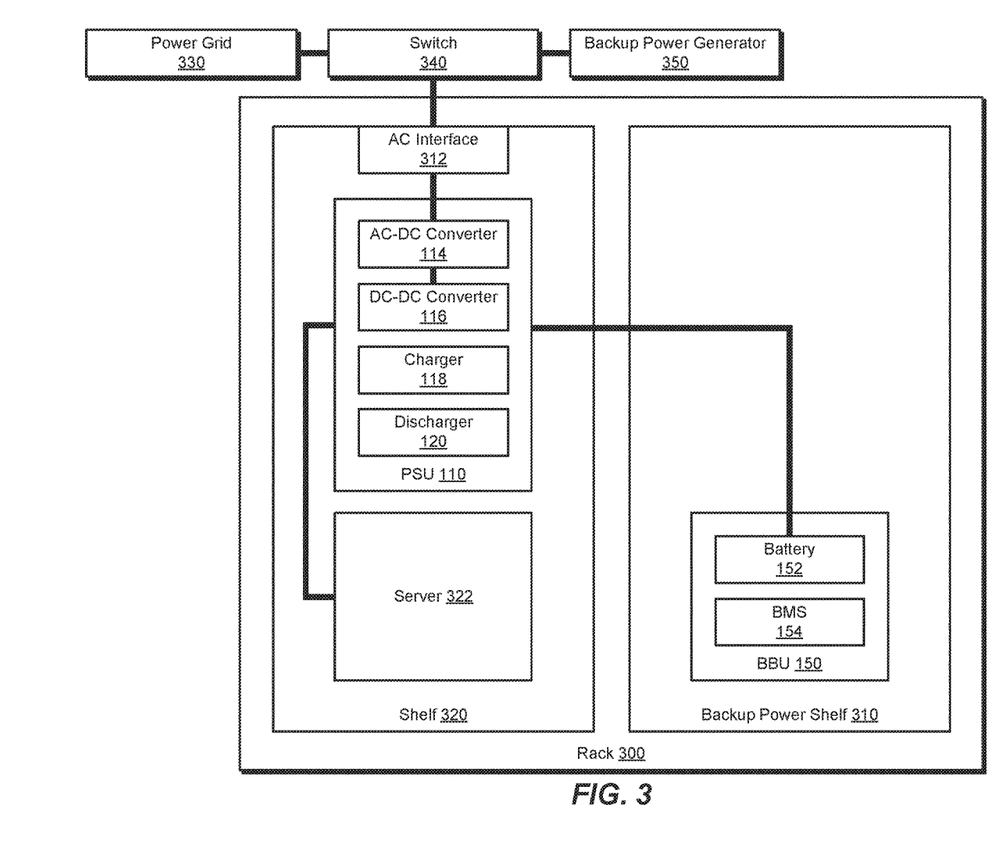
FIG. 3 is a block diagram of an example configuration of an exemplary power-supply system for charging partial-use batteries.

In some examples, portions of example power-supply system 100 may be divided amongst two or more shelves of a data-center rack. For example, as shown in FIG. 3, portions of example power-supply system 100 may represent portions of one or more shelves (e.g., a backup power shelf 310 and a shelf 320) of example data-center rack 300 in FIG. 3. As shown, shelf 320 may include power-supply unit 110. In this example, backup power shelf 310 may include backup battery unit 150 and may be capable of providing backup power to power-supply unit 110, and power-supply unit 110 may provide uninterrupted power to the computing components of shelf 320 (e.g., server 322).

Figure 4:
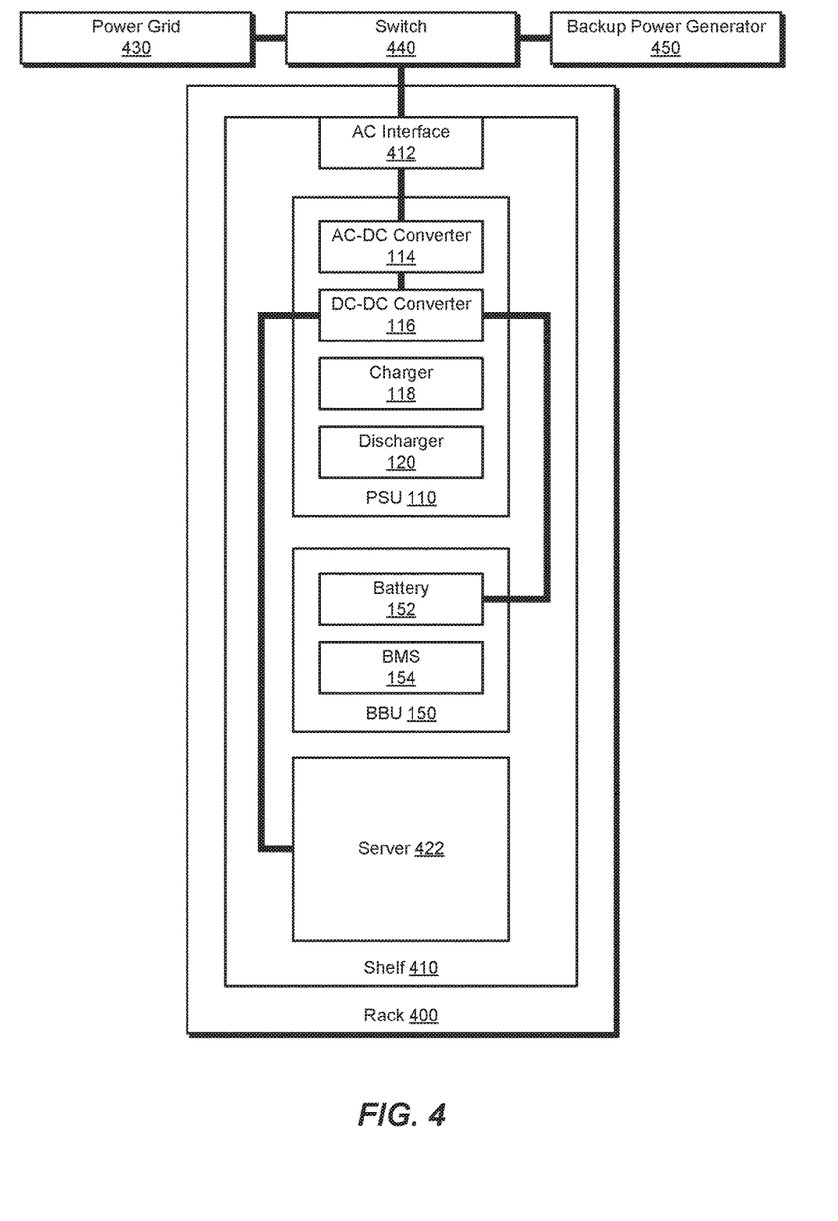
FIG. 4 is a block diagram of an example configuration of an exemplary power-supply system for charging partial-use batteries.

In some examples, all or a portion of example power-supply system 100 may represent portions of a single shelf of a data-center rack that contains both computing components as well as at least one power supply that provides uninterrupted power to the computing components. For example, as shown in FIG. 4, all or a portion of example power-supply system 100 may represent portions of a shelf 410 of example data-center rack 400 in FIG. 4. As shown, shelf 410 may include power-supply unit 110 and backup battery unit 150. In this example, backup battery unit 150 may be capable of providing backup power to power-supply unit 110 that provides uninterrupted power within shelf 410.

Figure 8:
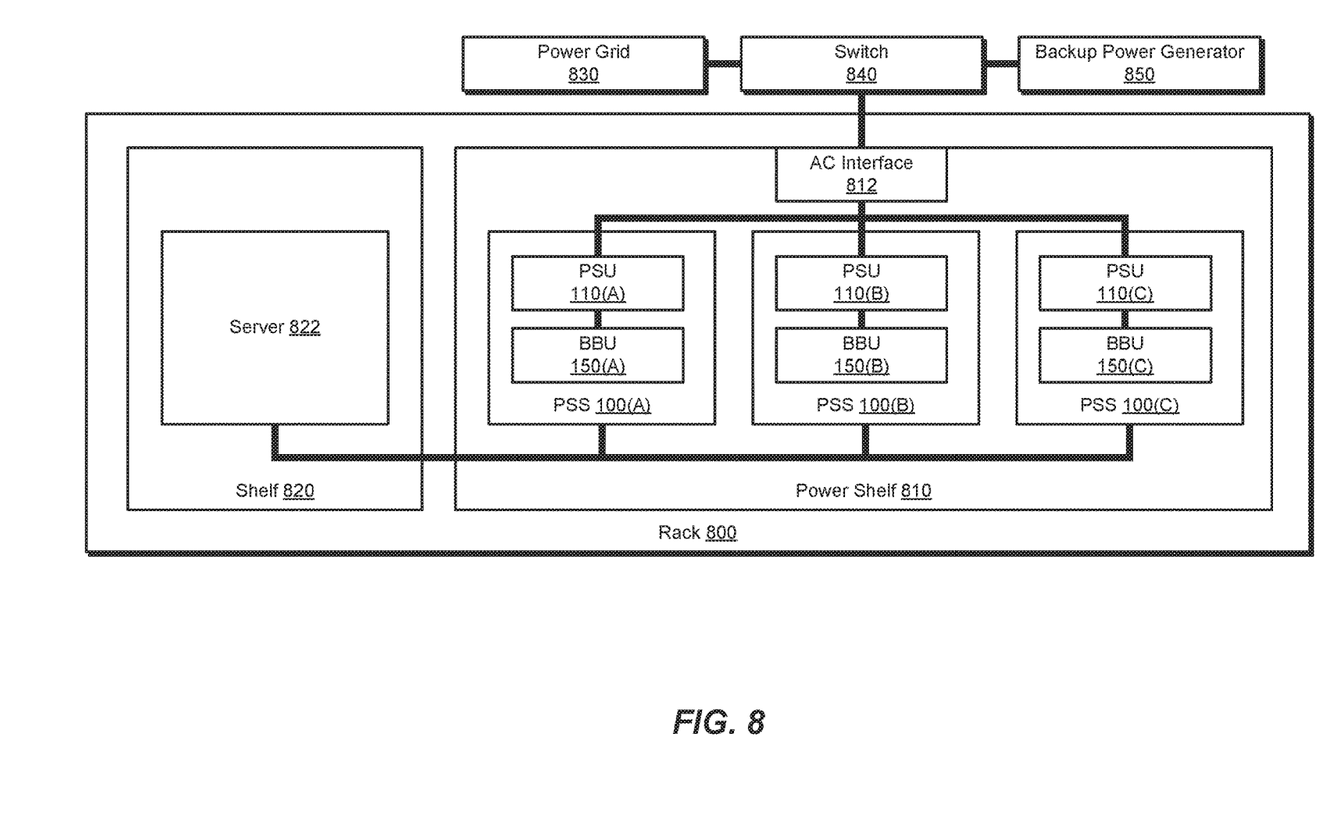
FIG. 8 is a block diagram of an example configuration of an exemplary redundant power-supply system for charging partial-use batteries.

The following is a description of the components illustrated in FIG. 1 as they are implemented and configured in FIG. 2, although it is understood that the same components and descriptions can be applied to the other examples illustrated in FIGS. 3, 4, and 8. As shown in FIG. 2, data-center rack 200 may include an alternating-current (AC) interface 212. AC interface 212 may receive an alternating current (AC) input from a power grid 230. In some embodiments, the AC input can be three-phase electric power. As indicated above, data-center rack 200 can include at least one power-supply unit 110. In the example illustrated in FIG. 2, power-supply unit 110 may convert the power provided by AC interface 212 to provide a power rail 224 from which computing components housed within the shelves of data-center rack 200 may draw power. In some examples, power-supply unit 110 may include AC-to-DC converter 114 to convert AC input power from AC interface 212 into a DC voltage. In some embodiments, AC-to-DC converter 114 may alternatively be implemented in AC interface 212. In some examples, power-supply unit 110 may also include DC-to-DC converter 116 that converts the DC voltage of AC-to-DC converter 114 to a second DC voltage usable by the electronic components hosted within the shelves of data-center rack 200.

In some examples, when power grid 230 provides uninterrupted power, AC interface 212, power-supply unit 110, and/or other power conversion or delivery components (not illustrated) may provide sufficient power to keep the electronic components within data-center rack 200 operational. However, when a power outage occurs, data-center rack 200 may rely on one or more backup power components. For example, data-center rack 200 may rely on battery backup unit 150 and a backup power generator 250 (e.g., a diesel AC generator). Battery backup unit 150 may include one or more batteries (e.g., battery 152) that may provide enough power to keep the electronic components within data-center rack 200 running for a short period of time (e.g., a few seconds or minutes). Backup power generator 250 on the other hand may provide enough power to keep the electronic components within data-center rack 200 running for a much longer period of time (e.g., multiple minutes or even hours). A power switch 240 may draw AC power from backup power generator 250 when power grid 230 fails to provide sufficient power. However, backup power generator 250 may take some time to become fully operational (e.g., capable of providing stable and uninterrupted power to the electronic components within data-center rack 200). As an example, a diesel backup generator may take a minute or longer before providing stable power. Accordingly, battery backup unit 150 may provide power after power grid 230 fails, but before the backup power generator 250 becomes fully operational. Battery backup unit 150 may also provide power after power grid 230 is restored during a transition back to power provided from power grid 230 from power provided by backup power generator 250.

Although not explicitly illustrated in FIG. 2, data-center rack 200 may include a state-of-health testing system. In some examples, the state-of-health testing system may be a part of battery backup unit 150 and/or may include at least estimating module 158 and calculating module 160. In some examples, the state-of-health testing system may be located outside of battery backup unit 150 (e.g., as a separate component). The state-of-health testing system may perform capacity-degradation testing of battery 152 according to a schedule or based on randomized testing. The capacity-degradation testing may involve discharging a specified amount of energy from battery 152. While the foregoing described the components illustrated in FIG. 2, the same or similar descriptions may be applied to the examples illustrated in FIGS. 3, 4, and 8.

Figure 5:
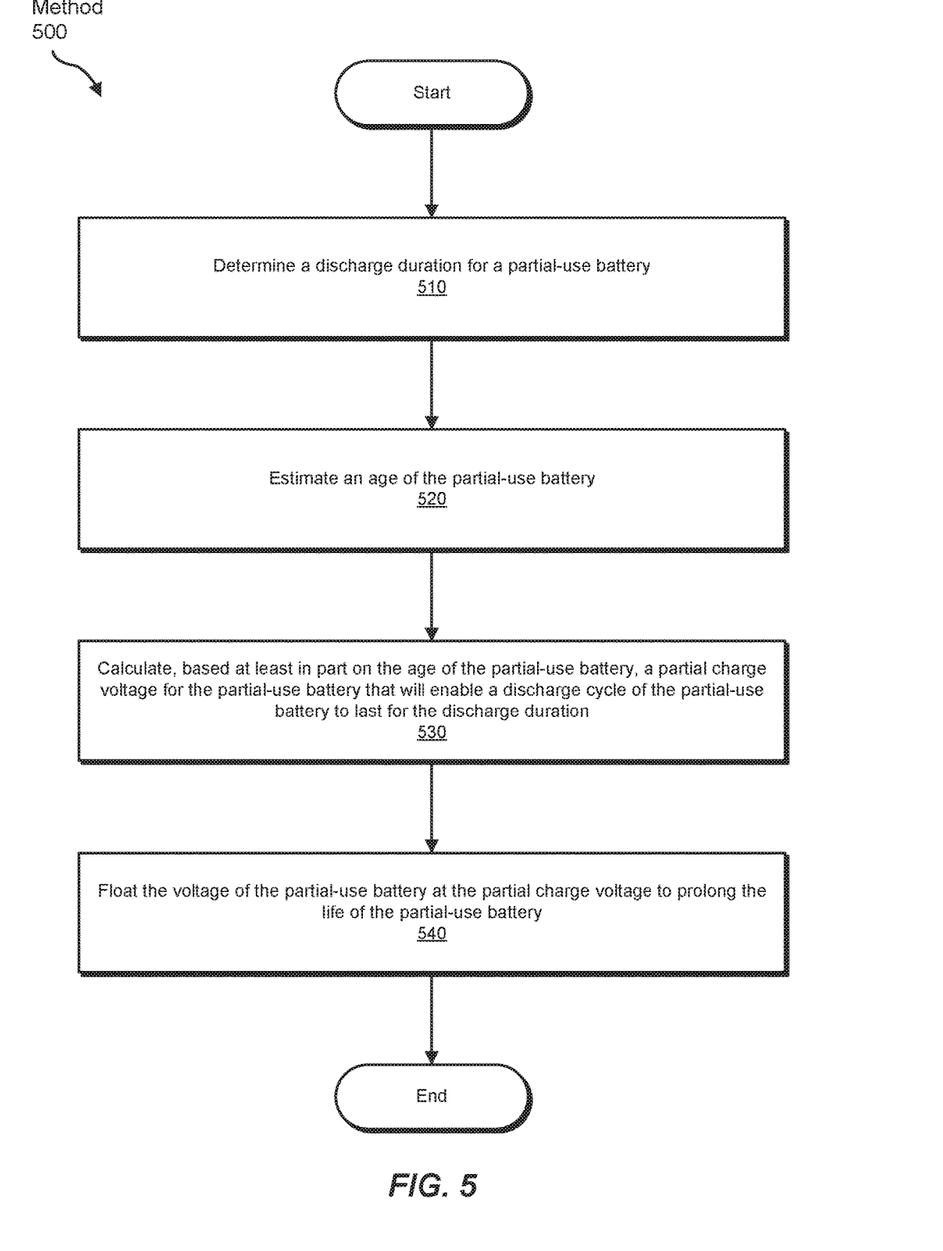
FIG. 5 is a flow diagram of an exemplary method for charging partial-use batteries.

FIG. 5 is a flow diagram of an example computer-implemented method 500 for charging partial-use batteries. The steps shown in FIG. 5 may be performed by any suitable computer-executable code and/or computing system, including power-supply system 100 in FIG. 1 and/or variations or combinations of one or more of the same. In one example, each of the steps shown in FIG. 5 may represent an algorithm whose structure includes and/or is represented by multiple sub-steps, examples of which will be provided in greater detail below.

As illustrated in FIG. 5, at step 510, one or more of the apparatus or systems described herein may determine a discharge duration for a partial-use battery. As used herein, the term "discharge duration" generally refers to an amount of time that a partial-use battery is expected to supply power while performing a specific function. In some examples, the term "discharge duration" may refer to an amount of time that a partial-use battery of a power supply is expected to supply backup power to or for the power supply while the power supply transitions from one power source to another. In some examples, a discharge duration of such a partial-use battery may be equal to an expected or worst-case transition time and/or may include a buffer duration or safety factor in addition to the expected or worst-case transition time. In some examples, a discharge duration of a partial-use battery that is used to supply backup power for a power supply that receives auxiliary power from a backup generator may be equal to an expected or worst-case start-up time of the backup generator and/or may include a buffer duration or safety factor in addition to the expected or worst-case start-up time. For example, if a backup generator has an expected start-up time of 20 seconds and a worst-case start-up time of 45 seconds, a discharge duration of the partial-use battery that is used to supply backup power for a power supply that receives auxiliary power from the backup generator may be equal to 90 seconds (i.e., two times the worst-case start-up time).

The apparatus or systems described herein may determine a discharge duration for a partial-use battery in a variety of ways. For example, determining module 156 may determine a discharge duration for a battery by reading a configuration file or hardware register that stores a value that indicates a predetermined discharge duration for the partial-use battery. In some examples, a system administrator or manufacture may have set the value based on knowledge of the discharge durations needed by a particular system (e.g., knowledge of sufficient discharge durations that enable power supplies to transition from primary power sources to auxiliary power sources). Additionally or alternatively, determining module 156 may monitor discharge durations of a partial-use battery to determine expected, average, or worst-case discharge durations. For example, determining module 156 may identify a suitable discharge duration for a partial-use battery that is used to supply backup power for a power supply that receives auxiliary power from a backup generator by monitoring the durations of the power supply's transitions between primary and auxiliary power sources.

Returning to FIG. 1, at step 520, one or more of the apparatus or systems described herein may estimate an age of the partial-use battery. As used herein, the term "age" generally refers to a measurement or indication of a battery's capacity and/or a measurement or indication of a change to a battery's capacity over time. In some examples, a battery's age may be measured in units of time (e.g., months or days), as percentages of the battery's initial or nominal capacity (e.g., 60% of nominal capacity), a percentage by which the battery's capacity has degraded, and/or any other suitable unit of measure. The term "capacity," as used herein, may refer to a battery's expected or actual available capacity. In some examples, a battery's capacity may represent an amount of electric charge that the battery may deliver at a particular voltage. In some examples, a battery's capacity may be equal to the number of hours for which the battery is able to provide a current that is equal to a particular discharge rate starting from a particular initial voltage (e.g., the battery's nominal voltage or a partial charge voltage).

The apparatus and systems described herein may estimate a partial-use battery's age in any suitable manner. In general, estimating module 158 may determine a partial-use battery's age by determining and/or comparing the partial-use battery's present capacity with a reported or nominal capacity of the partial-use battery and/or an initial or prior measured capacity of the partial-use battery (e.g., the partial-use battery's capacity when the partial-use battery was manufactured or first put into service). In some examples, estimating module 158 may perform a state-of-health test on a partial-use battery to determine the present capacity of the partial-use battery. In some examples, estimating module 158 may write a value indicating a partial-use battery's present capacity to an associated register. For example, after measuring the present capacity of battery 152, estimating module 158 may store its value to present-capacity register 168.

In some examples, a partial-use battery may include or be associated with one or more registers that record prior measurements of the partial-use battery's capacity (e.g., as illustrate in FIG. 1). In these examples, estimating module 158 may determine these capacities by reading their values from these registers. Using FIG. 1 as an example, estimating module 158 may determine a nominal, reported, or advertised capacity of battery 152 by reading its value from nominal-capacity register 164 and a measured capacity of battery 152 by reading its value from measured-capacity register 166. In some examples, a manufacturer may have recorded, when battery 152 was manufactured, the nominal capacity of battery 152 to nominal-capacity register 164 and/or the initial capacity of battery 152 to measured-capacity register 166.

In some examples, the apparatus or systems described herein may need to partially or completely discharge a partial-use battery that is used to supply backup power to a power supply in order to determine the partial-use battery's current capacity, which may cause the power supply to be unable to provide uninterrupted power while the current capacity of its partial-use battery is being measured. For at least this reason, a computing system may be configured with redundant power supplies. FIG. 8 illustrates a data-center rack 800 that includes a power shelf 810 that includes three power-supply units in a 2+1 redundant configuration. In this example, battery backup unit 150(A) may supply backup power to power-supply unit 110(A), battery backup unit 150(B) may supply backup power to power-supply unit 110(B), and battery backup unit 150(C) may supply backup power to power-supply unit 110(C). In this example, the apparatus and systems described herein may alternatingly estimate the ages of the backup batteries of battery backup units 150(A)-(C) so that a sufficient number of power supplies are available to provide needed power to the components contained in data-center rack 800 when power grid 830 experiences a disruption and power-supply units 110(A)-(C) must transition to receiving power from backup power generator 850.

Returning to FIG. 1, at step 530, one or more of the apparatus or systems described herein may calculate, based at least in part on the age of the partial-use battery, a partial charge voltage for the partial-use battery that will enable a discharge cycle of the partial-use battery to last for the discharge duration. As used herein, the term "partial charge voltage" generally refers to a voltage value to which a battery charger should charge a partial-use battery that is less than (1) the nominal voltage of the partial-use battery and/or (2) the voltage of the partial-use battery when the partial-use battery is considered to be fully charged. The term "discharge cycle," as used herein, generally refers to a complete discharge of a battery from an initial charge voltage (e.g., a partial charge voltage).

Figure 6:
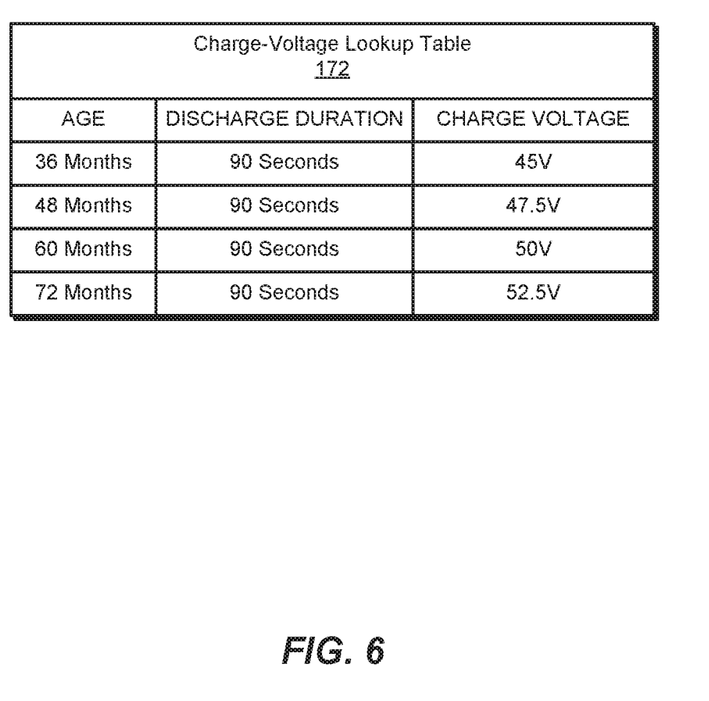
FIG. 6 is a block diagram of an exemplary lookup table for determining suitable partial charge voltages.

The apparatus or systems described herein may calculate a partial charge voltage for a partial-use battery in any suitable manner. In one example, calculating module 160 may use the backup duration identified at step 510 and the age estimated at step 520 to query a lookup table (e.g., charge-voltage lookup table 172 as illustrated in FIG. 6) that contains values supplied by a battery vendor that indicate, for a particular age of a partial-use battery, the charge voltage that needs to be supplied to the partial-use battery so that the partial-use battery can supply power for a specified duration. Using FIG. 6 as an example, once it has been determined that the discharge duration of battery 152 must be 90 seconds and once the age of battery 152 has been determined to be 36 months, calculating module 160 may use these values to query charge-voltage lookup table 172 to determine that battery 152 should be charged to 45 volts to enable a discharge cycle of battery 152 to last for the necessary 90-second discharge duration. If at a later time the age of battery 152 is determined to be 60 months, calculating module 160 may again query charge-voltage lookup table 172 using this updated age to determine that battery 152 should be charged to 50 volts to enable a discharge cycle of battery 152 to last for the necessary 90-second discharge duration.

In some examples, after determining a partial charge voltage for a partial-use battery, the apparatus or systems described herein may write a value indicating the partial charge voltage to a designated register. For example, after determining a partial charge voltage for battery 152, calculating module 160 may write its value to charge-voltage register 170.

Returning to FIG. 1, at step 540, one or more of the apparatus or systems described herein may float the voltage of the partial-use battery at the partial charge voltage to prolong the life of the partial-use battery.

The apparatus or systems described herein may float the voltage of a partial-use battery at a partial charge voltage in any suitable manner. In some examples, the apparatus or systems described herein may include or be a part of a battery charger and may float the voltage of a partial-use battery at a partial charge voltage by simply charging (e.g., using a constant-current/constant-voltage method) the partial-use battery until the partial-use battery's voltage reaches the partial charge voltage and/or by maintaining the voltage of the partial-use battery at the partial charge voltage.

In some examples, the apparatus or systems described herein may operate independent of a battery charger. In these examples, the apparatus or systems described herein may instruct the battery charger to charge the battery to the partial charge voltage. In one example, the apparatus or systems described herein may instruct a battery charger to charge a partial-use battery via an analog or digital communication channel. Additionally or alternatively, a partial-use battery may be associated with a register that may be accessed by a battery charger that may contain a value that indicates the partial charge voltage to which the battery charger should charge the partial-use battery. To instruct the battery charger to charge the partial-use battery to a particular partial charge voltage, the apparatus and systems described herein may write a value indicating the partial charge voltage to the register and then instruct the battery charger to charge the partial-use battery. In this example, the battery charger may access the register in order to determine the partial charge voltage to which to charge the partial-use battery.

Using FIG. 1 as an example, battery backup unit 150 may include charge-voltage register 170 that may be accessible to charger 118 of power-supply unit 110. In this example, a value indicating a partial charge voltage may have been written to charge-voltage register 170 at step 530, and charging module 162 may float the voltage of battery 152 at this partial charge voltage by issuing a command to battery charger 118 to charge battery 152. In this example, in response to receiving the command, battery charger 118 may charge battery 152 by (1) reading the value indicating the partial charge voltage from charge-voltage register 170 and (2) charging battery 152 to the indicated partial charge voltage.

Figure 7:
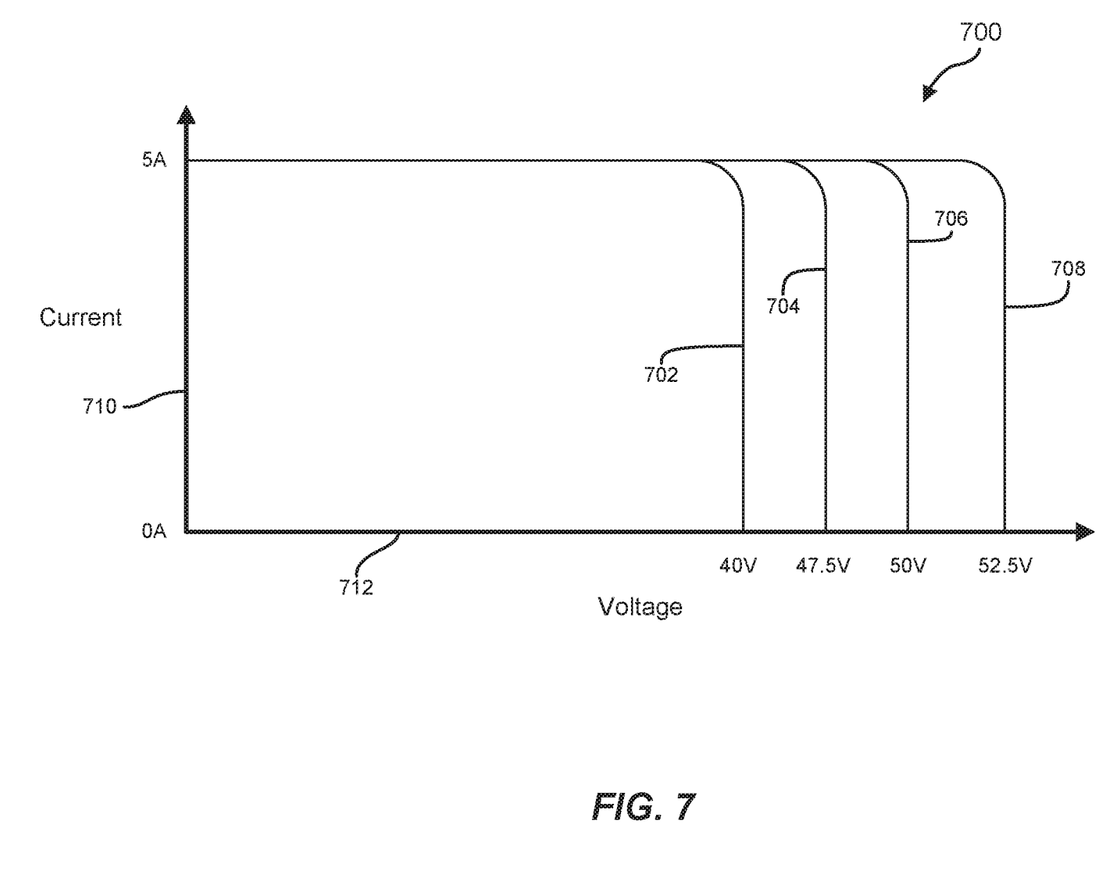
FIG. 7 is a graph diagram illustrating example current/voltage curves used for charging partial-use batteries.

In some examples, the apparatus and systems described herein may periodically perform method 500 in order to update the partial charge voltage of a partial-use battery to reflect its current age. The apparatus and systems described herein may perform method 500 at any suitable interval (e.g., once every 90 days) that ensures that a partial-use battery may deliver enough electrical charge to a power supply while the power supply transitions between its power sources. FIG. 7 illustrates an exemplary current/voltage graph 700 that includes four current/voltage curves that correspond to the partial charge voltages illustrated in FIG. 6 and that may be used to charge a single partial-use battery whose associated discharge duration has been determined to be 90 seconds. In this example, current/voltage curve 702 may represent the current/voltage curve used to charge the partial-use battery when the partial-use battery's age is equal to 36 months, current/voltage curve 704 may represent the current/voltage curve used to charge the partial-use battery when the partial-use battery's age is equal to 48 months, current/voltage curve 706 may represent the current/voltage curve used to charge the partial-use battery when the partial-use battery's age is equal to 60 months, and current/voltage curve 708 may represent the current/voltage curve used to charge the partial-use battery when the partial-use battery's age is equal to 72 months.

As described above, by partially charging a partial-use battery so that a discharge cycle of the partial-use battery can last for at least a needed discharge duration rather than charging the partial-use battery to an unnecessarily high voltage level (e.g., a voltage level at which the partial-use battery is considered fully charged), the apparatus, systems, and methods described herein may prolong the lifespan of the partial-use battery. In some examples, the apparatus and/or systems described herein may include a smart battery charger for data centers that improves the lifespans of rechargeable battery backup units used in the data centers by partially charging the rechargeable battery backup units based on their ages and their required discharge durations. Some exemplary data centers may include transformers that convert AC power to DC power for use by server computing devices. When AC power is lost at these data centers, generators may come on-line within 90 seconds. To avoid loss of power during these 90 seconds, a data center may use a rechargeable battery backup unit that supplies backup power. The battery backup unit may include rechargeable batteries (e.g., lithium-ion batteries). In some instances, the rechargeable batteries may not need to be fully charged in order for them to supply backup power for the 90 seconds. In these instances, the apparatus and systems described herein may increase the lifespan of the rechargeable batteries by charging the rechargeable batteries at variable voltages that are based on the ages of the rechargeable batteries.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

The term "memory device," as used herein, generally represents any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In addition, the term "physical processor," as used herein, generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

The term "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computer-implemented method comprising:
determining a transition duration for a partial-use battery of a power supply, wherein:
the power supply will make a transition from a first power source to a second power source;
the partial-use battery supplies power to the power supply during the transition; and
the transition is expected to last for the transitional duration;
estimating an age of the partial-use battery;
calculating, based at least in part on the age of the partial-use battery, a partial charge voltage for the partial-use battery that will enable a discharge cycle of the partial-use battery to last for the transition duration; and
floating the voltage of the partial-use battery at the partial charge voltage to prolong the life of the partial-use battery.

2. The computer-implemented method of claim 1, wherein
the partial-use battery comprises a backup lithium-ion battery.

3. The computer-implemented method of claim 1, wherein:
the first power source comprises mains power;
the second power source comprises one or more alternating-current generators; and
the transitional duration is equal to a sum of a start-up duration of the one or more alternating-current generators and a buffer duration.

4. The computer-implemented method of claim 1, wherein:
the first power source comprises one or more alternating-current generators; and
the second power source comprises mains power.

5. The computer-implemented method of claim 1, wherein the power supply supplies power within a data-center rack.

6. The computer-implemented method of claim 1, wherein the partial charge voltage is calculated to enable the discharge cycle of the partial-use battery to last for a sum of the transitional duration and a buffer duration.

7. The computer-implemented method of claim 1, wherein:
the partial charge voltage is less than a voltage limit of the partial-use battery; and
the voltage limit of the partial-use battery comprises one of:
a voltage of the partial-use battery when the partial-use battery is considered fully charged; or
a nominal voltage of the partial-use battery.

8. The computer-implemented method of claim 1, wherein estimating the age of the partial-use battery comprises using a nominal capacity of the partial-use battery to estimate the age of the partial-use battery.

9. The computer-implemented method of claim 1, wherein:
estimating the age of the partial-use battery comprises using a measured capacity of the partial-use battery to estimate the age of the partial-use battery; and
the measured capacity of the partial-use battery was measured when the partial-use battery was manufactured.

10. The computer-implemented method of claim 1, wherein estimating the age of the partial-use battery comprises:
measuring a present capacity of the partial-use battery; and
using the present capacity of the partial-use battery to estimate the age of the partial-use battery.

11. The computer-implemented method of claim 1, further comprising:
estimating, at a subsequent point in time, an updated age of the partial-use battery;
calculating, based at least in part on the updated age of the partial-use battery, an updated partial charge voltage for the partial-use battery that will enable a subsequent discharge cycle of the partial-use battery to last for the transition duration, wherein the updated partial charge voltage is greater than the partial charge voltage; and
floating the voltage of the partial-use battery at the updated partial charge voltage to further prolong the life of the partial-use battery.

12. The computer-implemented method of claim 1, wherein the transition duration is less than or equal to 90 seconds.

13. A backup-battery charging system comprising:
a power supply that will experience a transition from a first power source to a second power source, wherein the transition is expected to last for a transitional duration; and
a battery backup unit that comprises:
a backup battery that supplies power to the power supply during the transition;
a determining module, stored in memory, that determines a backup discharge duration for the backup battery, wherein the backup discharge duration is greater than or equal to the transitional duration;
an estimating module, stored in memory, that estimates an age of the backup battery;
a calculating module, stored in memory, that calculates, based at least in part on the age of the backup battery, a partial charge voltage for the backup battery that will enable a discharge cycle of the backup battery to last for the backup discharge duration;
a charging module, stored in memory, that floats the voltage of the backup battery at the partial charge voltage to prolong the life of the backup battery; and
at least one processor that executes the determining module, the estimating module, the calculating module, and the charging module.

14. The backup-battery charging system of claim 13, wherein the estimating module estimates the age of the backup battery based at least in part on at least one of:
a nominal capacity of the backup battery; or
a measured capacity of the backup battery that was measured when the backup battery was manufactured.

15. The backup-battery charging system of claim 13, wherein the estimating module estimates the age of the backup battery by:

measuring a present capacity of the backup battery; and using the present capacity of the backup battery to estimate the age of the backup battery.

16. The backup-battery charging system of claim 13, wherein:

the battery backup unit further comprises a register that is accessible to the power supply;

the charging module floats the voltage of the backup battery at the partial charge voltage by:

writing a value indicating the partial charge voltage to the register; and issuing a command to the power supply to charge the backup battery; and the power supply charges the backup battery in response to the command by:

reading the value indicating the partial charge voltage from the register; and charging the backup battery to the partial charge voltage.

17. The backup-battery charging system of claim 13, wherein:

the first power source comprises mains power;

the second power source comprises one or more alternating-current generators; and a start-up duration of the one more alternating-current generators is less than or equal to the transitional duration.

18. The backup-battery charging system of claim 13, wherein:

the power supply supplies power within a data-center rack;

the backup battery comprises a lithium-ion battery; and the backup discharge duration is less than or equal to 90 seconds.

19. A battery backup apparatus comprising:

a backup battery that supplies power to a power supply during a transition of the power supply from a first power source to a second power source, wherein the transition is expected to last for a transitional duration; and a battery-management subsystem that:

determines a backup discharge duration for the backup battery, wherein the backup discharge duration is greater than or equal to the transitional duration;

estimates an age of the backup battery;

calculates, based at least in part on the age of the backup battery, a partial charge voltage for the backup battery that will enable a discharge cycle of the backup battery to last for the backup discharge duration; and floats the voltage of the backup battery at the partial charge voltage to prolong the life of the backup battery.

20. The battery backup apparatus of claim 19, further comprising a register that is accessible to the power supply, wherein:

the battery-management subsystem floats the voltage of the backup battery at the partial charge voltage by:

writing a value indicating the partial charge voltage to the register; and issuing a command to the power supply to charge the backup battery; and the power supply charges the backup battery in response to the command by:

reading the value indicating the partial charge voltage from the register; and charging the backup battery to the partial charge voltage.

* * * * *

UNITED STATES PATENT AND TRADEMARK OFFICE
CERTIFICATE OF CORRECTION

PATENT NO. : 10,393,822 B1  
APPLICATION NO. : 15/654543  
DATED : August 27, 2019  
INVENTOR(S) : Soheil Ebrahimzadeh Page 1 of 1

It is certified that error appears in the above-identified patent and that said Letters Patent is hereby corrected as shown below:

On the Title Page

Column 1, item (54), Title, Line 2, delete "PARTIAL USE" and insert -- PARTIAL-USE --, therefor.

Column 2, item (56), other publications, Line 8, delete "Batieries"," and insert -- Batteries", --, therefor.

In the Specification

In Column 1, Title, Line 2, delete "PARTIAL USE" and insert -- PARTIAL-USE --, therefor.

Signed and Sealed this  
Twenty-second Day of October, 2019

Andrei Iancu  
*Director of the United States Patent and Trademark Office*